(12) United States Patent
de Aguiar et al.

(10) Patent No.: US 8,749,556 B2
(45) Date of Patent: Jun. 10, 2014

(54) DATA COMPRESSION FOR REAL-TIME STREAMING OF DEFORMABLE 3D MODELS FOR 3D ANIMATION

(75) Inventors: Edilson de Aguiar, El Cerrito, CA (US); Stefano Corazza, San Francisco, CA (US); Emiliano Gambaretto, San Francisco, CA (US)

(73) Assignee: Mixamo, Inc., San Francisco, CA (US)

( * ) Notice: Subject to any disclaimer, the term of this patent is extended or adjusted under 35 U.S.C. 154(b) by 897 days.

(21) Appl. No.: 12/579,334

(22) Filed: Oct. 14, 2009

(65) Prior Publication Data

US 2010/0149179 A1    Jun. 17, 2010

Related U.S. Application Data

(60) Provisional application No. 61/196,041, filed on Oct. 14, 2008.

(51) Int. Cl.
*G06T 13/00* (2011.01)

(52) U.S. Cl.
USPC ........................................................ 345/473

(58) Field of Classification Search
CPC ....... G06T 13/00; G06T 13/20; G06T 13/205; G06T 13/40; G06T 13/60
See application file for complete search history.

(56) References Cited

U.S. PATENT DOCUMENTS

| | | |
|---|---|---|
| 6,047,078 A | 4/2000 | Kang |
| 6,088,042 A | 7/2000 | Handelman et al. |
| 6,278,466 B1 | 8/2001 | Chen |
| 6,552,729 B1 | 4/2003 | Di Bernardo et al. |
| 6,554,706 B2 | 4/2003 | Kim et al. |
| 6,700,586 B1 | 3/2004 | Demers |

(Continued)

FOREIGN PATENT DOCUMENTS

| | | |
|---|---|---|
| EP | 1884896 A2 | 2/2008 |
| WO | 2007132451 A2 | 11/2007 |

(Continued)

OTHER PUBLICATIONS

Max Planck Institut Informatik; Automatic Conversion of Mesh Animations into Skeleton-based Animations; http://www.mpi-inf.mpg.de/~edeaguia/animation_eg08.html; Mar. 30, 2008.*

(Continued)

*Primary Examiner* — Carlos Perromat
(74) *Attorney, Agent, or Firm* — KPPB LLP

(57) ABSTRACT

Systems and methods are described for performing spatial and temporal compression of deformable mesh based representations of 3D character motion allowing the visualization of high-resolution 3D character animations in real time. In a number of embodiments, the deformable mesh based representation of the 3D character motion is used to automatically generate an interconnected graph based representation of the same 3D character motion. The interconnected graph based representation can include an interconnected graph that is used to drive mesh clusters during the rendering of a 3D character animation. The interconnected graph based representation provides spatial compression of the deformable mesh based representation, and further compression can be achieved by applying temporal compression processes to the time-varying behavior of the mesh clusters. Even greater compression can be achieved by eliminating redundant data from the file format containing the interconnected graph based representation of the 3D character motion that would otherwise be repeatedly provided to a game engine during rendering, and by applying loss-less data compression to the data of the file itself.

6 Claims, 7 Drawing Sheets

(56) References Cited

U.S. PATENT DOCUMENTS

| | | |
|---|---|---|
| 6,714,200 B1 | 3/2004 | Talnykin et al. |
| 7,168,953 B1 | 1/2007 | Poggio et al. |
| 7,209,139 B1 | 4/2007 | Keet et al. |
| 7,522,165 B2 | 4/2009 | Weaver |
| 7,937,253 B2 | 5/2011 | Anast et al. |
| 2002/0050988 A1 | 5/2002 | Petrov et al. |
| 2003/0164829 A1 | 9/2003 | Bregler et al. |
| 2003/0169907 A1 | 9/2003 | Edwards et al. |
| 2003/0208116 A1 | 11/2003 | Liang et al. |
| 2003/0215130 A1 | 11/2003 | Nakamura et al. |
| 2004/0021660 A1 | 2/2004 | Ng-Thow-Hing et al. |
| 2004/0049309 A1 | 3/2004 | Gardner et al. |
| 2004/0227752 A1 | 11/2004 | McCartha et al. |
| 2005/0264572 A1 | 12/2005 | Anast et al. |
| 2006/0002631 A1 | 1/2006 | Fu et al. |
| 2006/0109274 A1 | 5/2006 | Alvarez et al. |
| 2006/0134585 A1 | 6/2006 | Adamo-villani et al. |
| 2006/0171590 A1 | 8/2006 | Lu et al. |
| 2006/0245618 A1 | 11/2006 | Boregowda et al. |
| 2006/0267978 A1 | 11/2006 | Litke et al. |
| 2007/0104351 A1 | 5/2007 | Yang et al. |
| 2007/0182736 A1 | 8/2007 | Weaver |
| 2008/0024487 A1 | 1/2008 | Isner et al. |
| 2008/0031512 A1 | 2/2008 | Mundermann et al. |
| 2008/0043021 A1 | 2/2008 | Huang et al. |
| 2008/0158224 A1 | 7/2008 | Wong et al. |
| 2008/0170077 A1 | 7/2008 | Sullivan et al. |
| 2008/0180448 A1 | 7/2008 | Anguelov et al. |
| 2008/0252596 A1 | 10/2008 | Bell et al. |
| 2009/0027337 A1 | 1/2009 | Hildreth |
| 2009/0195544 A1 | 8/2009 | Wrinch |
| 2009/0231347 A1 | 9/2009 | Omote |
| 2010/0020073 A1 | 1/2010 | Corazza et al. |
| 2010/0073361 A1 | 3/2010 | Taylor et al. |
| 2010/0134490 A1 | 6/2010 | Corazza et al. |
| 2010/0259547 A1 | 10/2010 | de Aguiar et al. |
| 2010/0278405 A1 | 11/2010 | Kakadiaris et al. |
| 2010/0285877 A1 | 11/2010 | Corazza |
| 2011/0292034 A1 | 12/2011 | Corazza et al. |
| 2012/0019517 A1 | 1/2012 | Corazza et al. |
| 2012/0038628 A1 | 2/2012 | Corazza et al. |
| 2013/0021348 A1 | 1/2013 | Corazza et al. |
| 2013/0127853 A1 | 5/2013 | Corazza |

FOREIGN PATENT DOCUMENTS

| | | |
|---|---|---|
| WO | 2009/007701 A1 | 1/2009 |
| WO | 2010/060113 A1 | 5/2010 |
| WO | 2010/129721 A2 | 11/2010 |
| WO | 2010/129721 A3 | 6/2011 |
| WO | 2011/123802 A1 | 10/2011 |
| WO | 2012012753 A1 | 1/2012 |

OTHER PUBLICATIONS

E. de Aguiar, C. Theobalt, S. Thrun, and H.-P. Seidel, Automatic Conversion of Mesh Animations into Skeleton-based Animations. Eurographics 2008, Crete, Greece; Apr. 2008.*

Mamou et al., Temporal DCT-based compression of 3D dynamic meshes. ICCOM'06 Proceedings of the 10th WSEAS international conference on Communications, pp. 74-79; 2006.* von Luxburg; A Tutorial on Spectral Clustering. Statistics and Computing, 17 (4); 2007.*

Mamou et al., The New MPEG-4/FAMC Standard for Animated 3D Mesh Compression. IEEE 3DTV-CON'08, May 2008.*

Lewis, Notes—H.264/MPEG-4 AVC CABAC overview. http://www.theonlineoasis.co.uk/notes.html; retrieved Dec. 3, 2012.*

Tung et al., Topology Matching for 3D Video Compression; Computer Vision and Pattern Recognition, 2007. CVPR '07. IEEE Conference on; Jun. 2007.*

Beaudoin et al., Adapting Wavelet Compression to Human Motion Capture Clips, GI '07 Proceedings og Graphics Interface 2007.*

International Search Report for International Application No. PCT/US 09/57155, date completed Dec. 22, 2009, date mailed Jan. 12, 2010, 5 pgs.

International Search Report for International Application No. PCT/US 09/65825, date completed Jan. 21, 2010, date mailed Jan. 28, 2010, 3 pgs.

International Search Report for International Application PCT/US2011/045060, completed Nov. 27, 2011, 2 pgs.

Written Opinion for International Application PCT/US2011/045060, completed Nov. 27, 2011, 5 pgs.

International Search Report for PCT/US2010/033797, filed May 5, 2010, report completed Jun. 11, 2010, 2 pgs.

Written Opinion for PCT/US2010/033797, filed May 5, 2010, completed Jun. 11, 2010, 4 pgs.

Written Opinion of the International Searching Authority for International Application No. PCT/US 09/57155, date completed Dec. 22, 2009, date mailed Jan. 12, 2010, 6 pgs.

Written Opinion of the International Searching Authority for International Application No. PCT/US 09/65825, date completed Jan. 21, 2010, date mailed Jan. 28, 2010, 6 pgs.

Aguiar, E. De et al., "Automatic Conversion of Mesh Animations into Skeleton-based Animations", Eurographics 2008, Apr. 2008, 9 pgs.

Anguelov et al., "Recovering Articulated Object Models from 3D Range Data", In Proceedings of the 20th Conference on Uncertainty in Artificial Intelligence, pp. 18-26.

Anguelov et al., "SCAPE: Shape Completion and Animation of People", Proceedings of the SIGGRAPH Conference, 2005.

Anguelov et al., "The Correlated Correspondence Algorithm for Unsupervised Registration of Nonrigid Surfaces", In Conference on Computer Vision and Pattern Recognition (CVPR) pp. 77-84.

Cheung et al., "Shape-from Silhouette of Articulated Objects and its use for Human Body Kinematics Estimation and Motion Capture", In Conference on Computer Vision and Pattern Recognition (CVPR), pp. 77-84, 2003.

Curless at al., "The Space of Human Body Shapes: Reconstruction and Parameterization form Range Scans", ACM Transactions on Graphics, 22(3), pp. 587-594., 2003.

Curless et al., "A Volumetric Method of Building Complex Models from Range Images", Proceedings of SIGGRAPH 1996, pp. 302-312, 1996.

Curless et al., "A Volumetric Method of Building Complex Models from Range Images", Retrieved from http://graphics.stanford.edu/papers/volrange/volrange.pdf, pp. 1-10, 1996.

Curless et al., "Articulated Body Deformation from Range Scan Data", ACM Transactions on Graphics, 21(3), pp. 612-619.

Davis et al., "Filing Holes in Complex Surfaces Using Volumetric Diffusion", Symposium on 3 D Data Processing, Visualization, and Transmission, 2002.

De Aguiar et al., "Marker-Less 3D Feature Tracking for Mesh-Based Human Motion Caption", Human Motion 2007, LNCS 4818, 2007, 15 pgs.

Gao et al., "Motion normalization: the preprocess of motion data", 2005, pp. 253-256.

Garland et al., "Surface Simplification Using Quadric Error Metrics", Proceedings of SIGGRAPH 1997, pp. 209-216, 1997.

Hahnel et al., "An Extension of the ICP Algorithm for Modeling Nonrigid Objects with Mobile Robots", Proceedings of the International Joint Conference on Artificial Intelligence (IJCAI), 6 pgs., 2003.

Hilton et al., "From 3D Shape Capture to Animated Models", First International Symposium on 3D Processing, Visualization and Transmission (3DVPT2002), pp. 246-255, 2002.

Kahler et al., "Head shop: Generating Animated Head Models with Anatomical Structure.", ACM SIGGRAPH Symposium on Computer Animation, pp. 55-64, 2002.

Lewis, "H.264/MPEG-4 AVC CABAC overview", http://www.theonlineoasis.co.uk/notes.html, Dec. 3, 2012.

Lewis et al., "Pose Space Deformation: A Unified Approach to Shape Interpolation and Skeleton-Drive Deformation", Proceedings of ACM SIGGRAPH 2000, pp. 165-172, 2000.

Liepa, P., "Filing Holes in Meshes", Proc. of the Eurographics/ ACM SIGGRAPH Symposium on Geometry Processing, pp. 200-205, 2003.

(56) References Cited

OTHER PUBLICATIONS

Ma et al., "An Invitation to 3D Vision", Springer Verlag, pp. 15-28, 2004.
Mamou et al., "Temporal OCT-based compression of 3D dynamic meshes", ICCOM'06 Proceedings of the 10th WSEAS international conference on Communications, 2006, pp. 74-79.
Mamou et al., "The New MPEG-4/FAMC Standard for Animated 3D Mesh Compression", IEEE 3DTV-CON'08, May 2008.
Max Planck Institut Informatik, "Automatic Conversion of Mesh Animations into Skeleton-based Animations", Retrieved at: http://www.mpiinf.mpg.de/-edeaguia/animation_eg08.html, Mar. 30, 2008, 9 pgs.
Mohr et al., "Building Efficient, Accurate Character Skins from Examples", ACM Transactions on Graphics, 22(3), 562-568.
Noh et al., "Expression Cloning", Proceedings of ACM SIGGRAPH 2001, pp. 277-288, 2001.
Okada, R et al., "A Video Motion Capture System for InteractiveGames.", MVA2007 IAPR Conference on MachineVisionApplications, Tokyo, Japan Retrieved from: http://scholar.google.comlscholar?hl=en&lr=
&cltes=18279969631012262246&um=1&1e=UTF-8&sa=X
&el=7SEVTJPblsGlnQenipH-Cw&ved=OCDACzglwBA,
Retrieved on Jun. 11, 2010, May 16-8, 2007.
Park et al., "On-line locomotion generation based on motion blending", ACM SIGGRAPH Symposium on Computer Animation. San Antonio, Jul. 21, 2002, pp. 105-111.
Park et al., "On-line motion blending for real-time locomotion generation", Computer Animation & Virtual Worlds Wiley, UK vol. 15, No. 3-4, Jul. 2004, pp. 125-138.
Popovic et al., "Style-Based Inverse Kinematics", ACM Transactions n Graphics, 23(3), pp. 522-531, 2004.
Safonova et al., "Construction and optimal search of interpolated motion graphs", ACM SIGGRAPH, 2007, 11 pgs.
Sand et al., "Continuous Capture of Skin Deformation", ACM Transactions on Graphics, 22(3), pp. 578-586, 2003.
Scholkopf et al., "A Tutorial on support Vector Regression", In Technical Report NC2-TR-1998-030. NeuroCOLT2, 1998.
Seo et al., "An Automatic Modeling of Human Bodies from Sizing Parameters", In Symposium on Interactive 3D Graphics, 19-26.
Sloan et al., "Shape by Example", In 2001 Symposium on Interactive 3D Graphics, pp. 135-144, 2001.
Smola et al., "A Tutorial on Support Vector Regression", Statistics and Computing London 14(3) pp. 199-222, 2004.
Sumner et al., "Deformation Transfer for Triangle Meshes", Proceedings of ACM SIGGRAPH 2004, 23(3), pp. 399-405, 2004.
Szliski et al., "Matching 3D Anatomical Surfaces with Non-rigid Deformations Using Octree-splines", International Journal of Computer Vision, 1996, 18(2), pp. 171-186, 1996.
Tung et al., "Topology Matching for 3D Video Compression Computer Vision and Pattern Recognition", IEEE Conference Computer Vision and Pattern Recognition, 2007, Jun. 2007.
Vasilescu et al., "Multilinear Analysis of Image Ensembles: Tensorfaces", European Conference on Computer Vision (ECCV), pp. 447-460, May 2002.
Vlasic et al., "Face Transfer with Multilinear Models", ACM Transactions on Graphics 24(3), pp. 426-433, 2005.
Vlasic et al., "Multilinear Models for Facial Synthesis", SIGGRAPH Research Sketch, 1 pg., 2004.
Von Luxburg, "A Tutorial on Spectral Clustering. Statistics and Computing", 2007, 32 pgs.
Wang et al., "Multi-weight Enveloping: Least Squares Approximation Techniques for Skin Animation", ACM SIGGRAPH Symposium on Computer Animation, pp. 129-138, 2002.
Zhidong et al., "Control of motion in character animation", Jul. 14, 2004, pp. 841-848.
Anguelov et al., "The Correlated Correspondence Algorithm for Unsupervised Registration of Nonrigid Surfaces", Advance in Neural Information Processing Systems, 2005, 17, 33-40.
Baran et al., "Automatic rigging and animation of 3D characters", ACM Transactions on Graphics (TOG)—Proceedings of ACM SIGGRAPH 2007, vol. 26 Issue 3, Jul. 2007.
Beaudoin et al., "Adaptive Wavelet Compression to Human Motion Capture Clips", GI '07 Proceedings of Graphic Interface, 2007, 6 pgs.
Blanz et al., "A Morphable Model for the Synthesis of 3D Faces", In Proceedings of ACM SIGGRAPH 11999, 8 pgs.
Di Bernardo et al., "Generating Realistic Human Motions from Observations", submitted to Fifth European Conf. on Computer Vision, ECCV 1998, pp. 1-12.
Goncalves et al., Reach Out and Touch Space (Motion Learning), Automatic Face and Gesture Recognition, 1998. Proceedings. Third IEEE International Conference on Apr. 14-16, 1998, pp. 234-239.
Ju, et al., "Reusable Skinning Templates Using Cage-based Deformations", ACM Transactions on Graphics (TOG)—Proceedings of ACM SIGGRAPH Asia 2008, vol. 27 Issue 5, Dec. 2008, 10 pages.
Taylor et al., "Modeling Human Motion Using Binary Latent Variables", Proc. of Advances in Neural Information Processing Systems (NIPS) 19, 8 pgs.
Tao et al., "Mean Value Coordinates for Closed Triangular Meshes", Proceedings of ACM SIGGRAPH (2005), 6 pgs.

\* cited by examiner

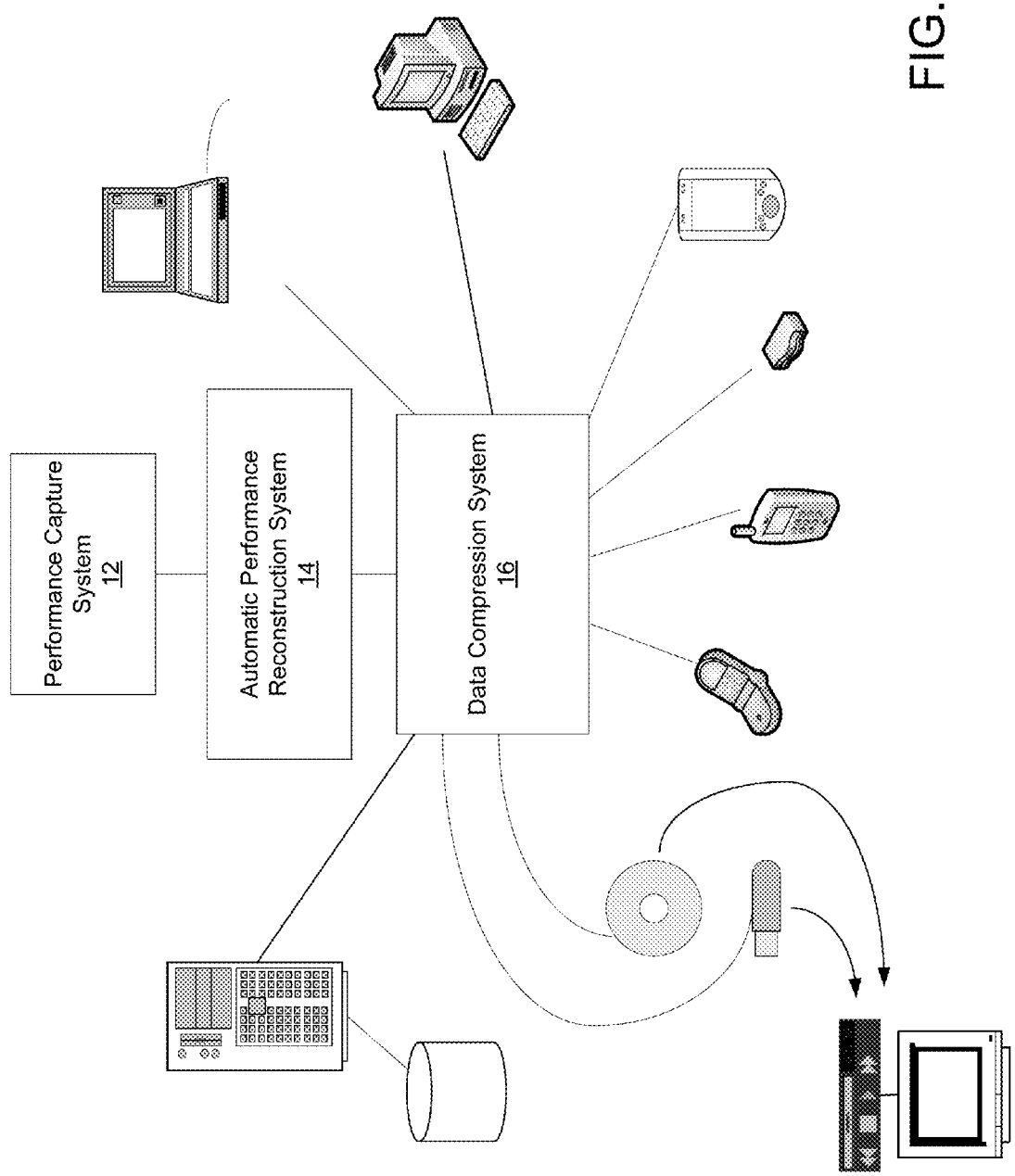

DATA COMPRESSION FOR REAL-TIME STREAMING OF DEFORMABLE 3D MODELS FOR 3D ANIMATION

CROSS-REFERENCE TO RELATED APPLICATIONS

The present application claims priority to U.S. Provisional Patent No. 61/196,041 entitled "Data Compression for Real-Time Streaming of Deformable 3D Models for 3D Animation" to De Aguiar et al., filed Oct. 14, 2008. The disclosure of U.S. Provisional Patent No. 61/196,041 is incorporated by reference herein in its entirety.

BACKGROUND

The invention relates to computer generated graphics and performance capture, and more specifically to compression and streaming of optical performance data captured using a deformable mesh based representation.

Three-dimensional (3D) graphics are widely used in many fields such as animation movies, video games, virtual worlds, virtual reality, simulation, ergonomics, industrial design, architecture and many others. In 3D graphics, moving characters are typically represented using skeleton based representations. A skeleton based representation involves defining the articulating body parts of a 3D character, attaching a surface or skinning the skeleton, and defining how the skin moves as the skeleton moves. The skeleton is manually defined either using software or by placing markers on an actor and capturing the optical performance of the actor. However, more recently, approaches have developed for capturing optical performances with higher fidelity using a deformable mesh based representation of the optical performance. Deformable mesh based representations as well as other new surface based scene capture techniques offer a great level of detail during 3D graphics creation being able for example to capture motion of hair and clothes. Unfortunately, the resulting scene representation is less compact than skeleton based models, because the deformable meshes involve the use of large amounts of data to dynamically represent independent position data streams for every vertex. As such, in order to display each mesh in real time for computer graphics applications for example, specific compression methods may be necessary. The need for compression grows as the quality and detail of the meshes increase. Additionally, there is not yet a rich toolbox available which enables easy post-processing and modification of deformable mesh based 3D graphics creation.

Thus, there is a need to overcome these above noted challenges while also overcoming the obstacles and shortcomings in the art.

SUMMARY

One embodiment of the invention includes specifying parameters for an interconnected graph based representation of the 3D character motion, automatically identifying mesh clusters within the deformable mesh based representation of the 3D character motion, automatically generating an interconnected graph based representation of the 3D character motion based upon the motion of the mesh clusters during the 3D character motion, and writing the interconnected graph based representation of the 3D character motion to a file located on a storage device.

In a further embodiment, automatically generating an interconnected graph based representation of the 3D character motion based upon the motion of the mesh clusters during the 3D character motion further includes generating an interconnected graph based upon the motion of the mesh clusters during the 3D character motion, and generating a smoothed mesh based upon the mesh clusters and the interconnected graph.

In another embodiment, the parameters include a maximum number of mesh clusters, and the number of automatically identified mesh clusters is limited to the maximum number of mesh clusters.

A still further embodiment also includes performing a temporal compression process on the time-varying behavior of the mesh clusters.

Still another embodiment includes eliminating redundant data from the interconnected graph based representation of the 3D character motion.

A yet further embodiment includes performing a process to loss-lessly compress at least some of the data within the file.

Yet another embodiment includes a processor connected to a storage device, where the processor is configured to receive data describing a deformable mesh based representation of 3D character motion. In addition, the processor is configured to automatically identify mesh clusters based upon the deformable mesh based representation of 3D character motion, the processor is configured to automatically generate an interconnected graph based representation of the 3D character motion based upon the identified mesh clusters and the deformable mesh based representation of the 3D character motion, and the processor is configured to write the interconnected graph based representation of the 3D character motion to a file on the storage device.

A further embodiment again includes at least one processor configured to receive an interconnected graph based representation of 3D character motion, where the interconnected graph based representation includes an interconnected graph, smoothed mesh clusters, and at least one motion definition. In addition, the at least one processor is configured to select a motion definition and use the motion definition and the interconnected graph to drive the smoothed mesh clusters and render a 3D character animation.

Many of the attendant features of the present invention will be more readily appreciated as the same becomes better understood by reference to the foregoing and following description and considered in connection with the accompanying drawings in which like reference symbols designate like parts throughout.

BRIEF DESCRIPTION OF THE DRAWINGS

FIG. 1 is a conceptual system diagram of the animation system in accordance with various embodiments of the present invention.

DETAILED DESCRIPTION

Figure 2A:
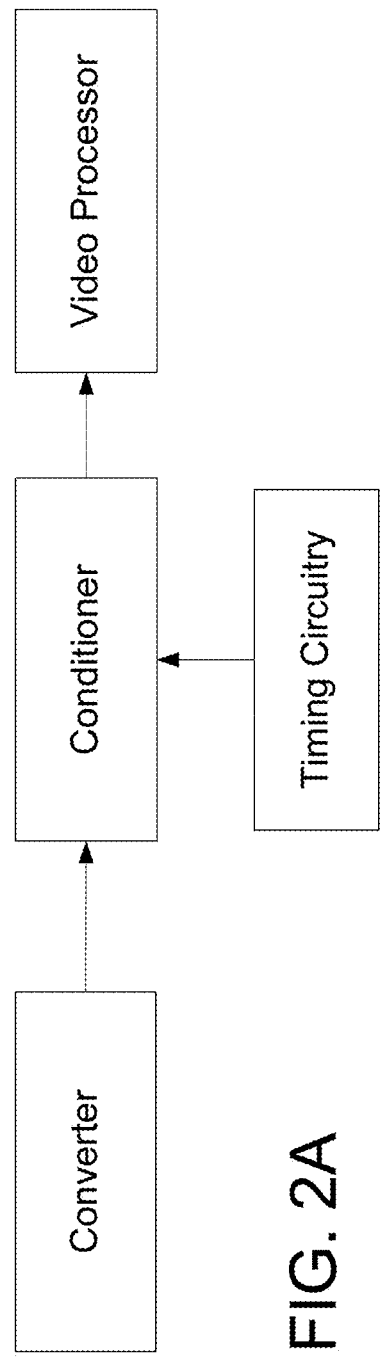
FIG. 2A is a block diagram of a compression/decompression system in accordance with various embodiments of the present invention.

Generally, systems and methods are provided that enable the compression and streaming of optical performance data captured using a deformable mesh based representation. The systems and methods provide a spatial and temporal compression of deformable mesh based representation of 3D character motion allowing the visualization of high-resolution 3D character animations in real time. In a number of embodiments, the deformable mesh based representation of the 3D character motion is used to automatically generate an interconnected graph based representation of the same 3D character motion. The interconnected graph based representation can include an interconnected graph that is used to drive mesh clusters during the rendering of a 3D character animation. The interconnected graph based representation provides spatial compression of the deformable mesh based representation, and further compression can be achieved by applying temporal compression processes to the time-varying behavior of the mesh clusters. Even greater compression can be achieved by eliminating redundant data from the file format containing the interconnected graph based representation of the 3D character motion that would otherwise be repeatedly provided to a game engine during rendering, and by applying loss-less data compression to the data of the file itself.

In one embodiment, optical performance data captured using a deformable mesh based representation is compressed by representing the optical performance using an interconnected graph and mesh clusters, where the interconnected graph and mesh clusters are automatically generated from the deformable meshes. The transformation of a deformable mesh based representation to an interconnected graph based representation (i.e., a representation including an interconnected graph and mesh clusters) can be referred to as a compression process, because the amount of data used to describe the interconnected graph based representation is significantly less than the amount of data used to describe the original deformable mesh based representation. Compression processes in accordance with embodiments of the invention are inherently lossy processes. A deformable mesh based representation expresses the motion of the vertices of individual meshes. An interconnected graph based representation attempts to achieve reductions in data storage and processing requirements relative to a deformable mesh based representation by effectively expressing the motion of groups of meshes or mesh clusters using the interconnected graph. The original mesh based representation cannot be recovered from the interconnected graph based representation. The high fidelity of the deformable mesh based representation, particularly with respect to small scale time varying shape detail in the captured performance such as clothing and hair, is a function of the deformable mesh based representation's ability to express the motion of vertices of individual meshes. Therefore, compression processes in accordance with many embodiments of the invention attempt to retain fine detail through appropriate selection of the interconnected graph to express the motion of small groups of meshes in regions of the performance involving high levels of detail and expressing the motion of large groups of meshes in regions of the performance involving low levels of detail. Accordingly, an interconnected graph based representation generated in accordance with an embodiment of the invention significantly reduces the amount of storage space and processing power used to represent the motion of a 3D character while still maintaining a high level of fidelity to the original optical performance.

The automated generation of an interconnected graph based representation of a 3D character motion can be contrasted with the generation of a skeleton based representation manually or via motion capture in that the interconnected graph drives the entire mesh as opposed to just defined articulating body parts. In a traditional skeleton based model, a skeleton is defined based upon articulation points, the skeleton is skinned, and the manner in which the skeleton drives the skin is defined. Such an approach has difficulty capturing small scale time varying shape detail, for example clothes and hair, that don't follow the bones of the skeleton. By contrast, an interconnected graph is automatically generated to drive mesh clusters identified from a deformable mesh representation, and not simply to articulate the body parts of the character. Stated another way, the interconnected graph is automatically generated based upon desired motion of the surface of the 3D character and a skeleton is manually defined (either by hand or by placement of markers during motion capture) to represent the articulation points of the 3D character's internal skeleton. An interconnected graph can also differ from a skeleton in that a skeleton is static and an interconnected graph can change dynamically over time. In several embodiments, the interconnected graph based representation includes an interconnected graph that changes from frame to frame or that changes as necessary. In several embodiments, the frequency with which the interconnected graph is changed is determined based upon a desired level of compression for the interconnected graph based representation.

In a number of embodiments, a combination of marker based and performance capture is utilized in the capturing of the original optical performance. In which case, a portion of the interconnected graph can be defined by the markers and the remainder of the interconnected graph can be generated from the portion of the performance captured using a deformable mesh representation.

The input to the method is a deformable mesh representation of a 3D character motion sequence comprising multiple frames. The deformable mesh representation includes a mesh model having multiple vertices and triangles and position data for each vertex at all time steps. The position coordinate sets and the mesh model provides a description of a 3D character's motion from which a 3D character animation can be rendered.

Spectral clustering is employed to group seed vertices on the mesh into approximately rigid segments. By using the clustered seed vertices, the moving mesh is segmented into kinematically meaningful approximately-rigid patches or mesh clusters. Thereafter, adjacent mesh clusters are determined and the topology of the kinematic structure of the mesh is found. In other embodiments, alternative processes for grouping meshes are utilized.

Using the estimated topology, joint positions defining an interconnected graph between interconnecting mesh clusters are calculated over time. In order to eliminate temporal bone length variations in the interconnected graph due to per-time step fitting inaccuracies, joint positions within the interconnected graph can be updated at all time steps or on an ongoing basis and an inverse kinematics approach is applied to determine the subject's joint parameters over time. In a last step, appropriate skinning weights are calculated to attach the learned interconnected graph to the surface to produce a complete interconnected graph based representation from the original deformable mesh based representation. The extent of the compression that is achieved can be impacted by the number of mesh clusters permitted in the interconnected graph and the frequency with which the interconnected graph is updated. The higher the number of mesh clusters, the more data required to describe the interconnected graph based representation and the closer the interconnected graph based representation is to expressing all of the information in the deformable mesh based model.

Processes in accordance with many embodiments of the invention automatically generate interconnected graphs by segmenting the mesh model from the input deformable mesh based representation into spatially coherent patches that undergo approximately the same rigid transformations over time. Initially, a subset of vertices that are distributed evenly over the mesh model are selected. For the selection of the seeds, a single reference pose, e.g., an initial pose, is selected and a curvature-based segmentation is employed to decompose the model into multiple surface patches. The seed vertices are chosen as the vertices closest to the centers of the patches. The motion trajectories of the seed vertices throughout the whole sequence form the input to the spectral clustering which automatically groups the seeds into a number of approximately rigidly moving groups or mesh clusters. The process utilizes the invariant that mutual distances between points on the same rigid part should only exhibit a small variance while the mesh is moving.

In order to use spectral clustering, a spatial affinity matrix is constructed in that the affinity values of vertex pairs with large average mutual distance is reduced, which forces spectral clustering to put spatially far apart groups of vertices with similar motion into separate mesh clusters.

Spectral clustering is robust and allows inferences of complex mesh cluster topologies as they are typical for our motion segmentation problem. Instead of grouping the vertices directly based on the individual values, spectral clustering uses the top eigenvectors of matrices derived from the spatial affinity matrix to cluster the vertices. This clustering is robust against outliers and leads to more robust and kinematically more meaningful segmentation. Additionally, the optimal number of clusters can be automatically calculated based on the data set's eigen-gap. In other embodiments, alternative processes for identifying mesh clusters are utilized.

Using optimal vertex clusters, triangle clusters are created by assigning each triangle to the closest seed vertex class considering the average Euclidean distance from a seed vertex. The resulting mesh clusters divide the mesh into multiple approximately rigid surface patches.

In one embodiment, a structurally motivated distance measure like a geodesic distance may also be used for clustering the triangles and to determine affinities. However, this may increase computation time considerably.

Given the list of mesh clusters, their associated seed vertices and triangle patches, an interconnected graph structure of the animated mesh is extracted by finding its kinematic topology (i.e., find which mesh clusters are adjacent) and, thereafter, by estimating the positions of the interconnecting joints for the whole sequence.

To determine which mesh clusters are adjacent, the triangles are analyzed at the boundaries of the triangle patches. Mesh clusters are considered adjacent if they have mutually adjacent triangles in their respective patch boundaries. In one embodiment, a patch may be adjacent to more than one other patch. If more than two patches are directly connected (e.g., patches associated with the surface of a head, torso and arm), mesh clusters are sorted to determine which are truly kinematically connected and which are not.

In one embodiment, a heuristic approach is used that considers only those patches to be adjacent that share the longest common boundary (in terms of the number of adjacent boundary triangles). For instance, if head, arm and torso are connected the number of neighboring triangles is calculated for all combinations of patch pairings (e.g., head-torso, head-arm and torso-arm) and do not assign the pair head-arm as adjacent mesh clusters since the head-arm mesh clusters have less neighbors in comparison with the other two options. For any adjacent pair of patches, a joint has to be found later. In one embodiment, the mesh cluster in the center of gravity of the mesh at the reference time step is the root of the hierarchy. In other embodiments, alternative processes for determining adjacent mesh clusters are utilized.

In order to estimate the joint positions between two adjacent mesh clusters, the information from the sets of seed vertices located on the mesh clusters only is considered, and not the information from all vertices. Instead of solving for the complete sequence of joint positions, the problem's complexity can be reduced by first aligning the segment poses to a reference time step (e.g., the pose at time t=0 in the sequence), then solving for a single optimal joint position with respect to the two mesh clusters in the reference pose, and finally retransforming the joint position into the original poses of the two mesh clusters. To serve this purpose, for each time step two rigid body transforms are computed that align the positions of the seed vertices in both sets with the positions of the seed vertices at the reference time step. In other embodiments, alternative processes for determining joint location are utilized.

For finding a joint location at the reference time, it can be assumed that a good estimate for the correct sequence of joint positions is the sequence of locations that minimizes the variance in joint-to-vertex distance for all seed vertices of the adjacent parts at all frames. Using this assumption solves for the joint location at the reference time by using a distance penalty based on the average Euclidean distance to regularize the solution. Alternatively, a regularization term is used by which the estimated joint position becomes closer to the centroid position of the boundary curve between the two adjacent body parts at all time steps. After identifying the optimal joint location, the joint positions at all other frames can be then computed. By repeating the above method to all mesh clusters, all joint positions for the whole sequence are constructed.

A consistent parameterization of an interconnected graph in terms of joint parameters is feasible when the interconnected graph has constant dimensions over time. However, due to possible errors generated by aligning the mesh clusters in the reference frame (mostly caused by subtle (non-rigid) relative motion between vertices on the same mesh cluster), the distance between vertices (i.e., joint positions) in the interconnected graph may slightly vary over time. The distances between vertices can be set to be constant by stepping through the hierarchy of the estimated interconnected graph from the root down to the leaves and correcting the joint positions for each pair of subsequent joints in the kinematic chain separately. In other embodiments, alternative processes for determining distances between vertices in the interconnected graph are utilized.

Skinning is the process of attaching the surface mesh to the interconnected graph in such a way that changes in the interconnected graph pose lead to plausible surface deformations. In one embodiment, a standard linear blend skinning or a skeletal subspace deformation (SSD) method is used as it is widely supported in games and animation packages. In other embodiments, alternative processes for skinning the surface mesh of the interconnected graph is utilized.

Therefore, in order to use the SSD method to re-animate the sequences using a more compact representation, weights for each vertex are determined that provide information on how much each mesh cluster influences each vertex.

The skinning weight distribution for each mesh cluster is then determined. In one embodiment, the distribution is based on the results of a heat diffusion process rather than based on simple vertex proximity to the mesh cluster, which makes the estimation process more robust. Additionally, the entire sequence of mesh and interconnected graph poses from the input are considered when finding optimal weights. In a particular embodiment, the weight distributions are solved for each separate video frame and thereafter averaged to obtain a final distribution. The final weight distributions for each mesh cluster are thus the average of the weights for all frames.

The heat diffusion process provides smooth and realistic blending weight distributions since it respects geodesic surface proximity during weight assignment rather than error prone Euclidean proximity. Additionally, by computing the optimal weights from all available poses, the generated interconnected graph representation faithfully reproduces the entire original mesh animation. Although heat diffusion processes are referenced above, other processes for determining blending weight distributions can be utilized in accordance with embodiments of the invention.

In performing the above process or similar processes to automatically generate an interconnected graph representation of 3D character motion based upon a deformable mesh based representation of the 3D character motion, the amount of compression that is achieved can be determined by a number of parameters. In many instances, a compression system in accordance with embodiments of the invention selects a number of mesh clusters intended to balance compression against loss of detail. Temporal compression can be achieved by expressing the time-varying behavior of the mesh clusters more efficiently by for example using a Fourier Transform, Wavelet Transform, or spline interpolation based representation. These representations provide further compression and different levels of performance depending on the type of motion to be encoded. Further compression can also be achieved by applying a loss-less compression process to the underlying data such as a Huffman coding variant.

In FIG. 1, a performance capture system captures a person's performance which includes the person's body, cloth and hair motion. The mesh-based performance capture system expresses the deformation of the whole model based on a few point handles. In particular, the capture system utilizes a plurality of video cameras that record a subject's movements for a specific amount of time or video frames. In one embodiment, prior to video-recording human performances, a full-body laser scan of the subject in its current apparel is taken. After scanning, the subject immediately moves to the adjacent multi-view recording area. Multi-view capturing apparatus can feature K=8 to 12 synchronized geometrically and calibrated video cameras. The cameras are typically placed in an approximately circular arrangement around the center of the scene (see video for visualization of input). As part of pre-processing color-based background subtraction is applied to all video footage to yield silhouette images of the captured performers.

Once all of the raw data has been captured, an automatic performance reconstruction pipeline 14 commences. The raw scan is thus transformed into a high-quality surface mesh with multiple vertices and triangles to obtain a computational model of shape and motion. Additionally, a coarser tetrahedral version of the surface scan including vertices and tetrahedrons is created.

In one embodiment, performances are captured in a multi-resolution way to increase reliability. For example, first, an analysis-through-synthesis method based on image and silhouette cues estimates the global pose of an actor at each frame on the basis of the lower-detail tetrahedral input model. The sequence of processing steps is designed to enable reliable convergence to plausible poses despite the highly multi-modal solution space of optimization-based mesh deformation. Once global poses are found, the high-frequency aspect of performances is captured. For instance, the motion of folds in a skirt is recovered in this step. To this end the global poses are transferred to the high-detail surface scan, and surface shape is refined by enforcing contour alignment and performing model-guided stereo. In other embodiments, various alternate techniques are used to identify and capture various low-frequency and high-frequency aspects of the performance.

The output of the method is a deformable mesh based representation, which is a dense representation of the performance in both space and time. It includes accurately deformed spatio-temporally coherent geometry that captures the liveliness, motion and shape detail of the original input.

In one embodiment, captured performance data is stored in a storage medium or device accessible at a later time and/or from a remote location. Captured performance data is supplied to a compression system 16 that compresses the performance data. The performance data is converted in one embodiment from a deformable mesh based representation to an interconnected graph based representation.

Referring now to FIG. 2, in one embodiment, the video cameras are utilized to capture performance data of a subject. This data is supplied to a converter and compression system that converts and compresses the deformable mesh based representation of the captured performance to an interconnected graph based representation of the captured performance. A data conditioner is then applied to regulate the stream or supply of the interconnected graph based representation based on timing data associated with the model relative to a clock signal or timing information to supply the proper interconnected graph based representation to a video processor to display the streamed data. The timing information in one embodiment is supplied by a processor executing an associated application for the animation to be displayed.

Figure 2B:
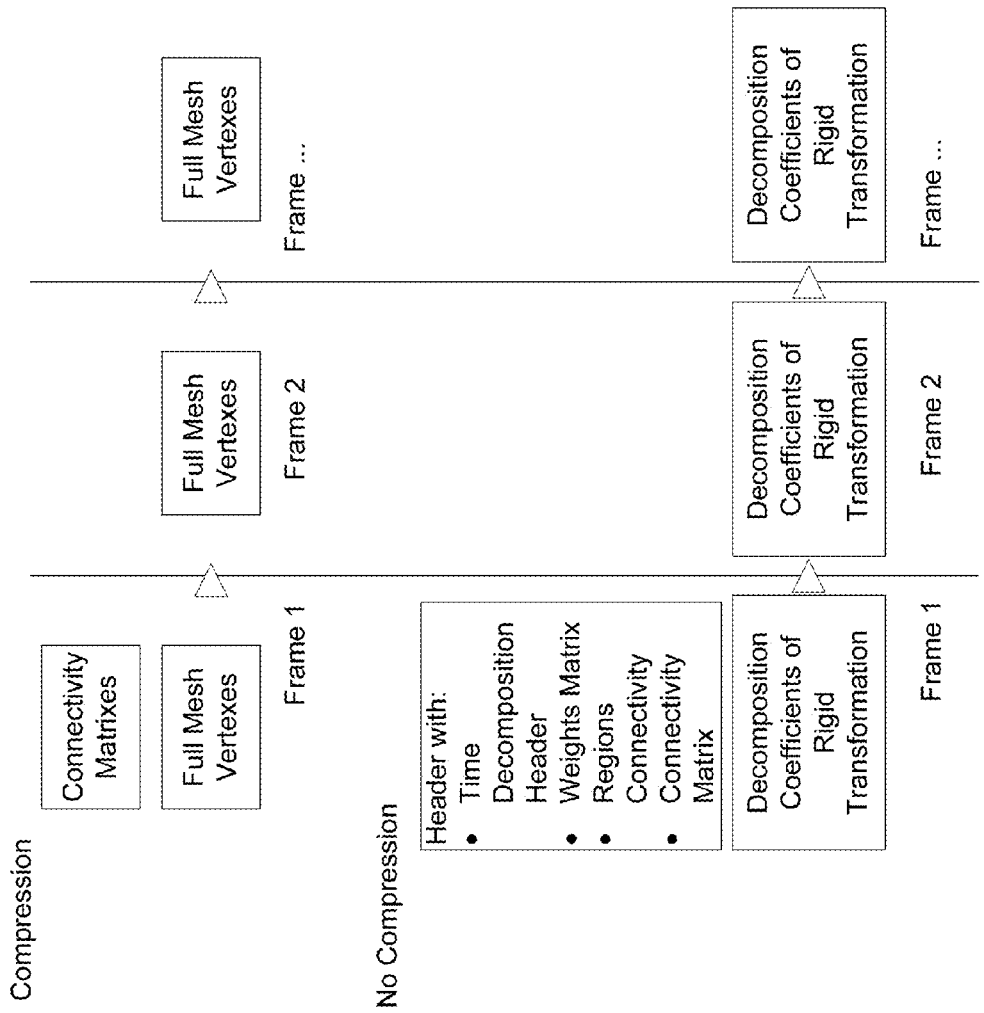
FIG. 2B is a conceptual block diagram illustrating conventional streaming versus compressed streaming in accordance with various embodiments of the present invention.

As shown in FIG. 2B conventional streaming versus compressed streaming is shown, in one embodiment, the compression system generates a header for the first video frame that includes a time decomposition header, weights matrix, an interconnected graph describing regions connectivity and a connectivity matrix. The converter converts full mesh vertexes into decomposition coefficients of rigid transformations of the mesh clusters for each video frame.

Figure 3:
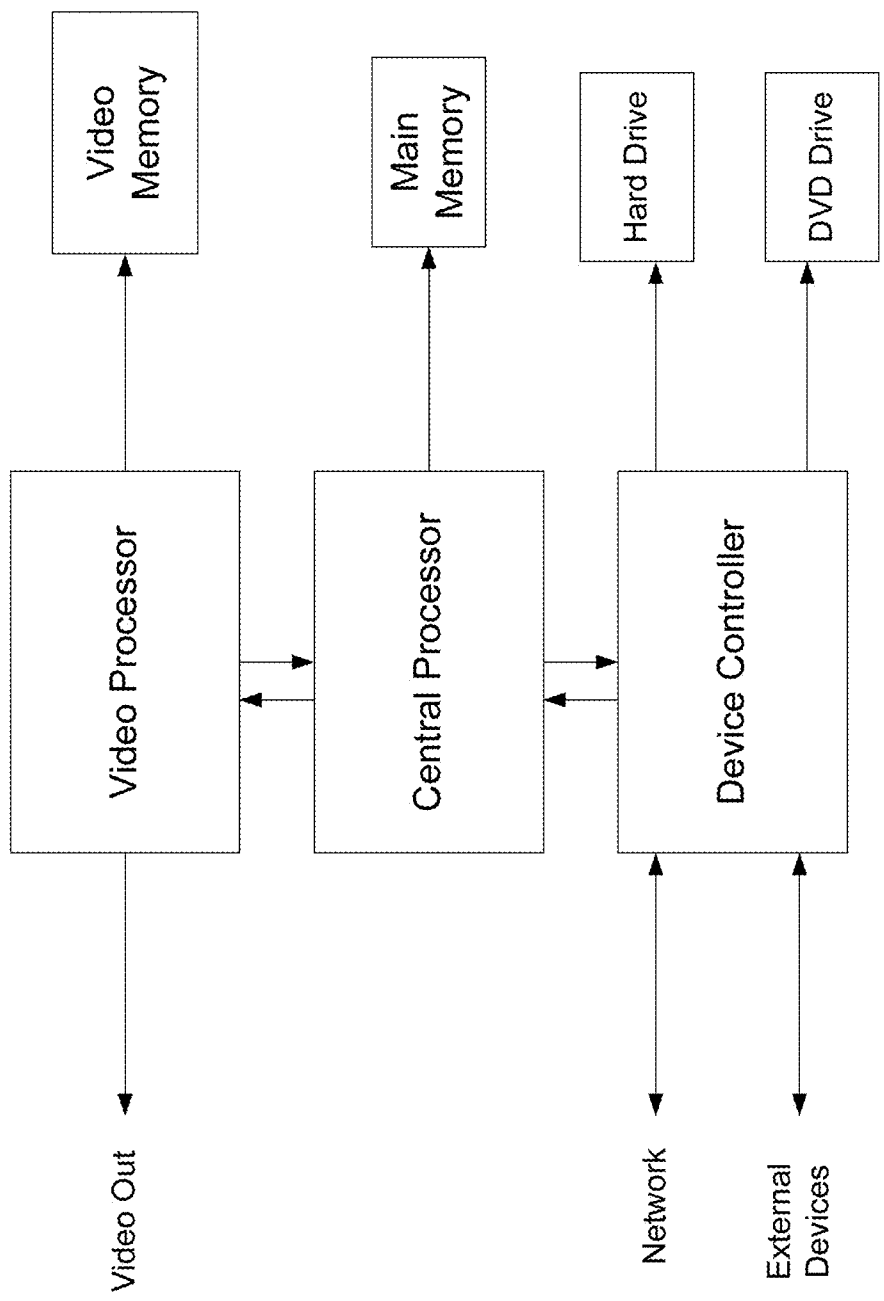
FIG. 3 is a block diagram of an end-user display device in accordance with various embodiments of the present invention.

In FIG. 3, an end-user device for processing and displaying an animated model in accordance with various embodiments of the present invention is provided. In a number of embodiments, the device includes a rendering engine (such as the game engine in a consumer electronics device—for example the Xbox360 manufactured by Microsoft Corporation of Redmond, Wash.) that is capable of rendering 3D character animations utilizing an interconnected graph based representation of various 3D character animations. The game engine utilizes the interconnected graph, the smoothed mesh clusters, and the definition of various types of motion provided in the interconnected graph based representation of the 3D character motion to render 3D character animations in real time.

In several embodiments, the interconnected graph based representation includes one interconnected graph, one smoothed mesh and a variety of motions. In a number of embodiments, a small set of interconnected graphs and associated smoothed meshes are provided for each 3D character. Each interconnected graph and smoothed mesh can be associated with a change in the character's clothes or with different types of motion e.g., running or swimming. In a number of embodiments, the file format containing the interconnected graph based representation of the 3D character provides further compression by eliminating redundant information, and the game engine is configured to read the compressed data. Examples of redundant data include data present in each frame that the game engine does not need to be continuously passed.

Figure 4:
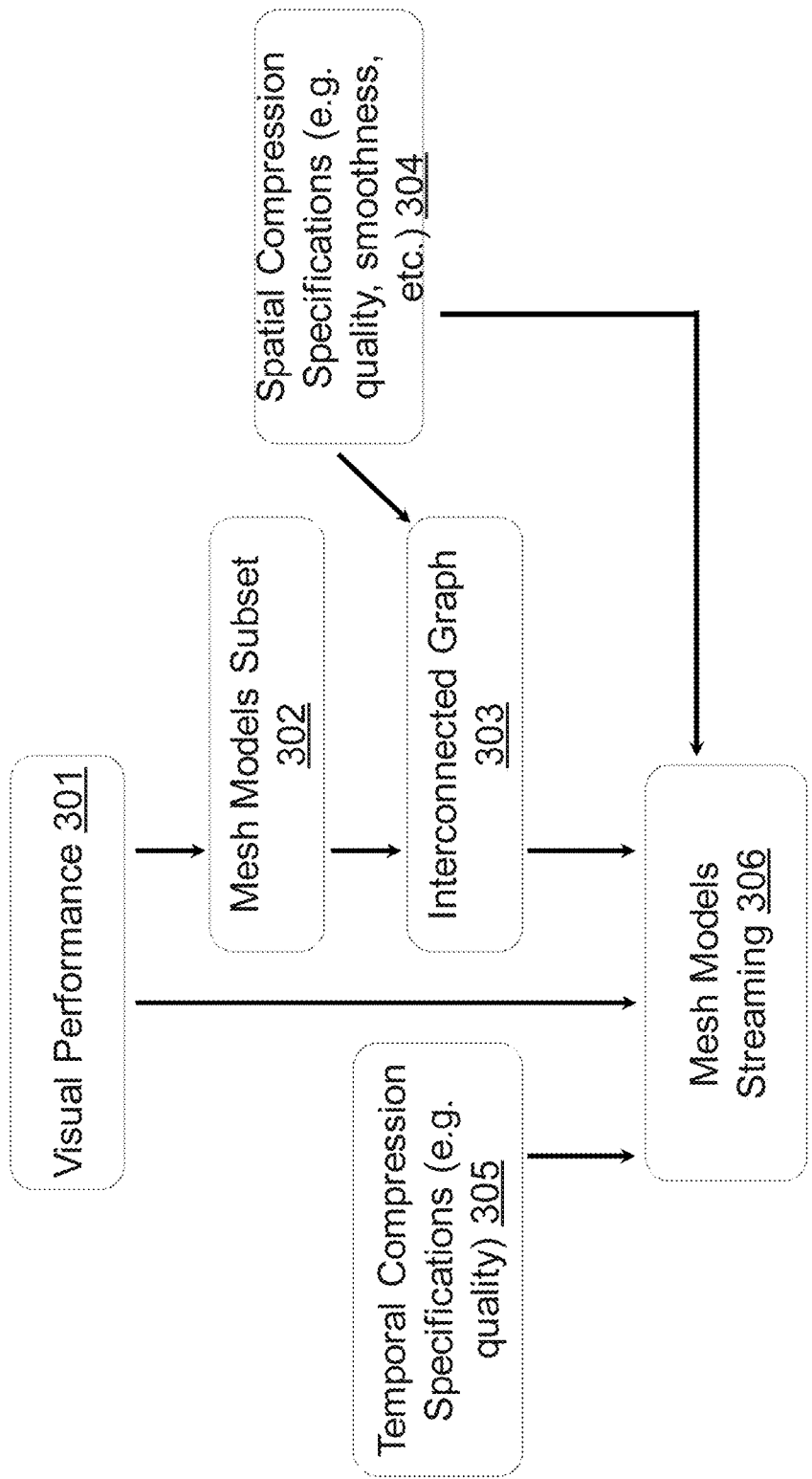
FIG. 4 is a flow chart of a conversion method in accordance with various embodiments of the present invention.

Referring to FIG. 4 a method of compressing deformable mesh based representations of an optical performance is illustrated. During the method, mesh models are supplied from a mesh based representation of an optical performance (301) for a predetermined set of video frames (302). The mesh models for a plurality of the frames are used to automatically generate an interconnected graph based representation (303) of the optical performance that is then used to generate each frame (306) according to given spatial (304) and temporal (305) specifications.

Figure 5:
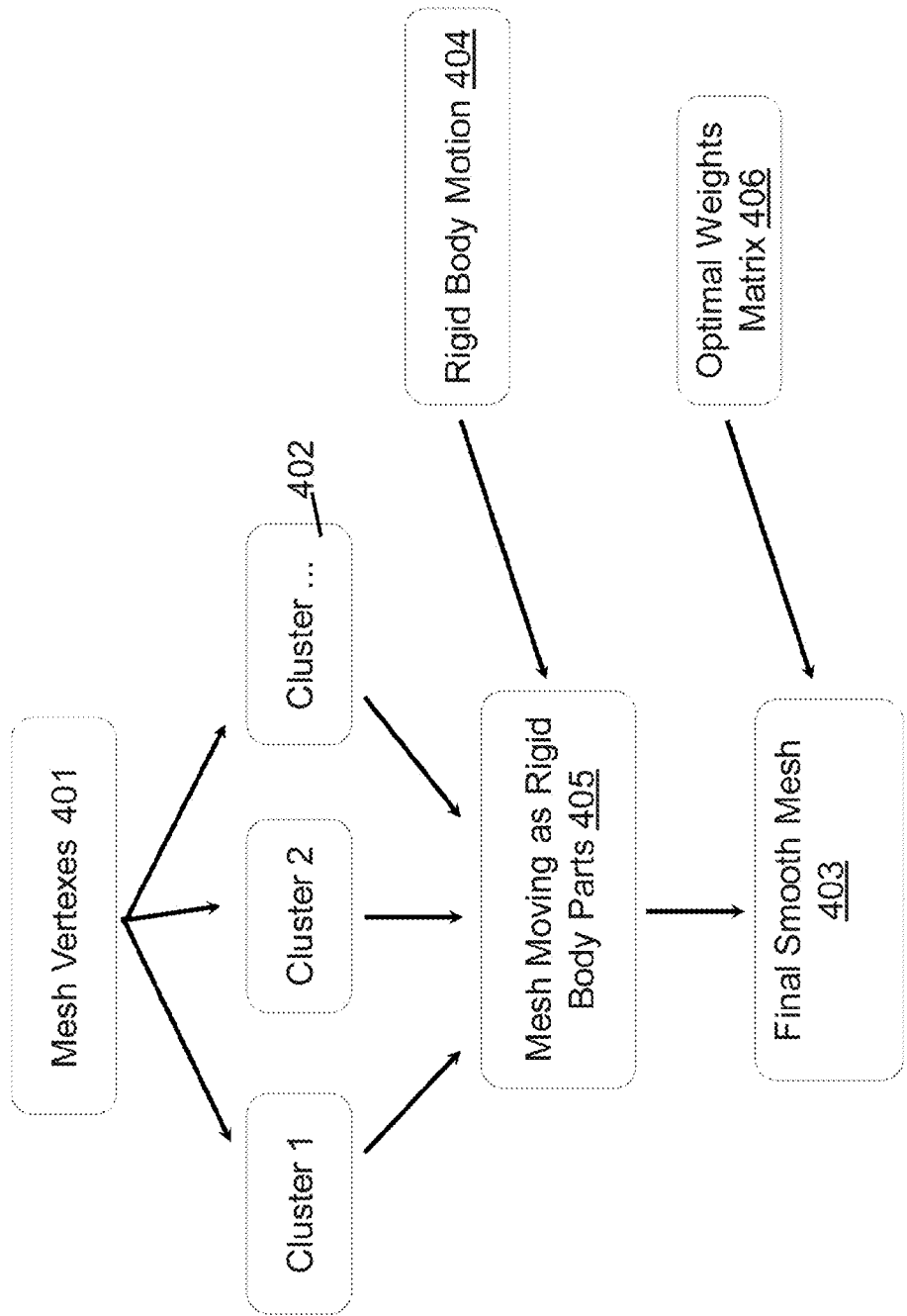
FIG. 5 is a flow chart of a compression method in accordance with various embodiments of the present invention.
Figure 6:
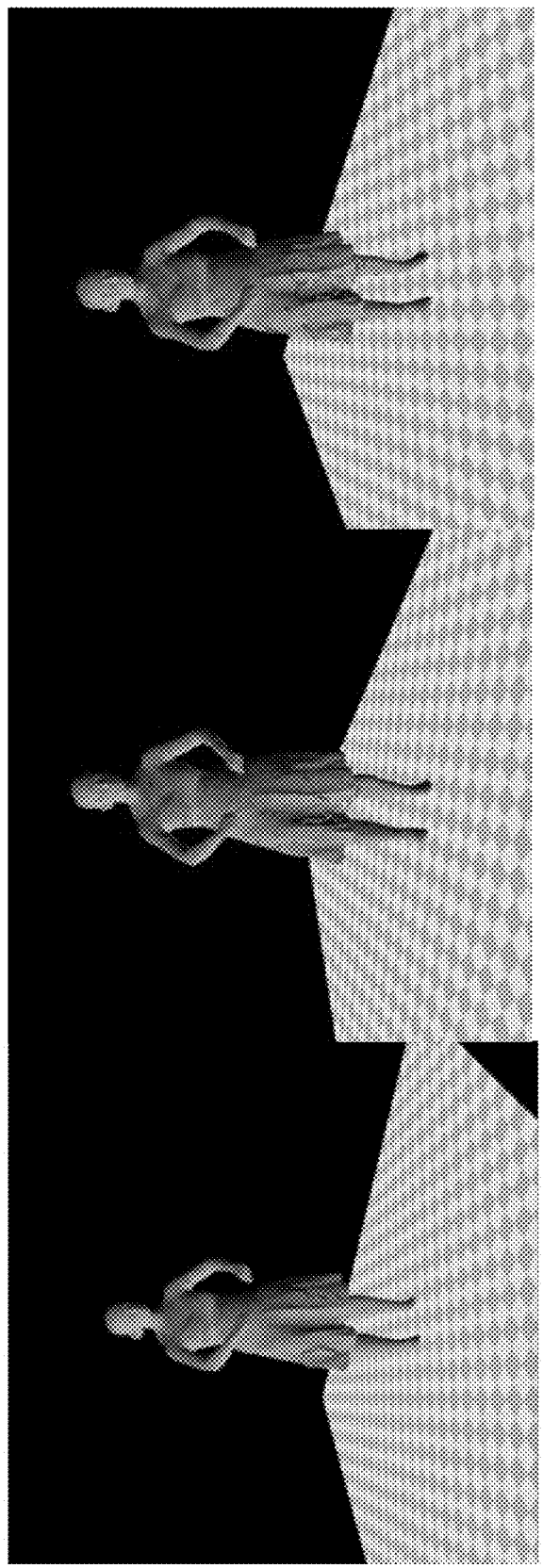
FIG. 6 illustrates a series of images providing compression results with 10, 50 and 100 clusters with increasing quality from left to right in accordance with various embodiments of the present invention.

In FIG. 5, vertexes (401) are clustered (402) according to the desired final visualization quality. The motion of the clusters of vertexes is expressed as rigid parts as a first pass in the process (405). To allow smoothness of the generated surface these weights are then handled by the matrixes of weights (406) that are then generated to allow smooth transitions between different clusters of vertexes in the final smooth mesh (403). This can be achieved by changing the weights of the vertexes closer to the part boundary. Different values of smoothness can be achieved based on user's input. Exemplary compression results are shown in FIG. 6 based upon specified maximum numbers of mesh clusters. The number of allowed mesh clusters increases from left to right in FIG. 6 from 10 (left), 50 (middle), and 100 (right) mesh clusters. The compression losses increase when the number of clusters is decreased. In particular, details like wrinkles are lost when the number of clusters drops below a threshold. In the illustrated example, the finer wrinkles are reproduced with fidelity in the 3D animation when the compressed interconnected graph based representation of the 3D character animation utilizes 100 mesh clusters. In other instances, the number of mesh clusters utilized will depend on factors including the level of fast moving fine detail in the 3D character motion.

In one embodiment, in order to optimally express the motion of clusters of vertexes as rigid part and thus compress the data spectral clustering is used. As such, a trade-off threshold can be defined between data quality loss and compression. In many embodiments, the threshold is a function of the number of clusters used in the compression of the mesh data. Additionally, a quantitative measurement of the data loss can be provided as expected deviation between the compressed and uncompressed mesh.

On top of the spatial compression described above, time compression is achieved by expressing the time-varying behavior of the mesh clusters. In various embodiments, Fourier Transform, Wavelet transform or spline interpolation techniques are used for time compression. In one embodiment, temporal compression is provided where the time-varying motion of the mesh clusters is expressed as a combination of sinusoidal functions as derived from Fourier Transform, as a combination of functions as derived from Wavelets Transform, and/or through spline interpolation. These techniques provide further compression capabilities and provide different levels of performance depending on the type of motion to be encoded. In one embodiment, the processed data is then loss-less compressed by a variant of the Huffman coding. In other embodiments, various temporal compression functions and loss-less compression algorithms can be utilized in accordance with the requirements of the specific application.

Although the present invention has been described in certain specific embodiments, many additional modifications and variations would be apparent to those skilled in the art. It is therefore to be understood that the present invention may be practiced otherwise than specifically described without departing from the scope and spirit of the present invention. Thus, embodiments of the present invention should be considered in all respects as illustrative and not restrictive.

What is claimed:

1. A process for compressing a deformable mesh based representation of 3D character motion, comprising:
   repeatedly specifying parameters for an interconnected graph based representation of portions of the 3D character motion wherein the parameters include a maximum number of mesh clusters used to generate the interconnected graph based representation of the portion of the 3D character motion, wherein the extent of the compression that is achieved is determined by the number of the maximum number of mesh clusters and the frequency with which the interconnected graph is updated;
   automatically identifying mesh clusters within the deformable mesh based representation of each portion of the 3D character motion wherein the number of automatically identified mesh clusters is limited to the maximum number of mesh clusters specified for the portion of the 3D character motion;
   automatically generating an interconnected graph based representation of each portion of the 3D character motion based upon the motion of the mesh clusters during the portion of the 3D character motion;
   performing a temporal compression process on the time-varying behavior of the interconnected graph based representations of the portions of the 3D character motion; and
   writing the compressed interconnected graph based representations of each portion of the 3D character motion to a file located on a storage device.

2. The process of claim 1, wherein automatically generating an interconnected graph based representation of a portion of the 3D character motion based upon the motion of the mesh clusters during the 3D character motion further comprises:
   generating an interconnected graph based upon the motion of the mesh clusters during the portion of the 3D character motion; and
   generating a smoothed mesh based upon the mesh clusters and the interconnected graph.

3. The process of claim 1, further comprising eliminating redundant data from an interconnected graph based representation of a portion of the 3D character motion.

4. The system of claim 1, wherein the processor is configured to automatically generate an interconnected graph based representation of a portion of the 3D character motion based upon the motion of the mesh clusters during the 3D character motion by:
   generating an interconnected graph based upon the motion of the mesh clusters during the portion of the 3D character motion; and
   generating a smoothed mesh based upon the mesh clusters and the interconnected graph.

5. A system configured to provide spatial and temporal compression of deformable mesh based representations of 3D character motion, comprising:

a processor connected to a storage device, where the processor is configured to receive data describing a deformable mesh based representation of 3D character motion, select an interconnected graph update frequency, and divide the deformable mesh based representation of 3D character motion into portions of 3D character motion based upon an interconnected graph update frequency;

wherein the processor is configured to automatically select a maximum number of mesh clusters for each portion of the 3D character motion and identify a number of mesh clusters that does not exceed the maximum number of mesh clusters based upon the deformable mesh based representation of each portion of the 3D character motion;

wherein the processor is configured to automatically generate an interconnected graph based representation of the portions of 3D character motion based upon the identified mesh clusters and the deformable mesh based representation of the 3D character motion and perform a temporal compression process on the time-varying behavior of the interconnected graph based representation of the 3D character motion; and wherein the processor is configured to write the interconnected graph based representation of the 3D character motion to a file on the storage device; and wherein the extent of the compression that is achieved is determined by the selected frequency with which the interconnected graph is updated and the selected maximum number of mesh clusters for the interconnected graph in each portion of 3D character motion.

6. The system of claim 5, wherein the processor is further configured to eliminate redundant data from an interconnected graph based representation of a portion of the 3D character motion.

* * * * *